US008823921B2

(12) United States Patent
Zlatanov et al.

(10) Patent No.: US 8,823,921 B2
(45) Date of Patent: Sep. 2, 2014

(54) PROGRAMMABLE ILLUMINATOR FOR A PHOTOLITHOGRAPHY SYSTEM

(75) Inventors: Borislav Zlatanov, San Jose, CA (US); Andrew M. Hawryluk, Los Altos, CA (US)

(73) Assignee: Ultratech, Inc., San Jose, CA (US)

( * ) Notice: Subject to any disclaimer, the term of this patent is extended or adjusted under 35 U.S.C. 154(b) by 607 days.

(21) Appl. No.: 13/199,112

(22) Filed: Aug. 19, 2011

(65) Prior Publication Data
US 2013/0044301 A1 Feb. 21, 2013

(51) Int. Cl.
*G03F 7/20* (2006.01)
*G02B 26/08* (2006.01)

(52) U.S. Cl.
CPC ........ *G03F 7/70066* (2013.01); *G03F 7/70558* (2013.01); *G02B 26/0833* (2013.01)
USPC .................... 355/67; 355/52; 355/53; 355/55; 355/71; 355/77

(58) Field of Classification Search
USPC ........... 355/30, 45, 46, 52, 53, 54, 55, 67–71, 355/72, 74, 77; 250/492.1, 492.2, 492.22, 250/493.1, 548; 430/5, 8, 22, 30, 311, 312, 430/321, 322
See application file for complete search history.

(56) References Cited

U.S. PATENT DOCUMENTS

| 5,097,137 | A | * | 3/1992 | Ogoh ......................... 250/492.2 |
| 5,811,211 | A | * | 9/1998 | Tanaka et al. .................... 430/30 |
| 6,457,830 | B1 | | 10/2002 | Choi |
| 6,758,579 | B2 | | 7/2004 | Ishikawa et al. |
| 7,116,402 | B2 | | 10/2006 | Gui |
| 7,253,882 | B2 | | 8/2007 | Ozaki et al. |
| 7,413,314 | B2 | | 8/2008 | Kim et al. |
| 7,766,507 | B2 | | 8/2010 | Nakajima |
| 7,784,949 | B2 | | 8/2010 | Yamauchi |
| 7,965,378 | B2 | | 6/2011 | Smirnov et al. |
| 7,973,996 | B2 | | 7/2011 | Shanley |
| 2001/0048515 | A1 | * | 12/2001 | Mei ................................. 355/71 |
| 2002/0136351 | A1 | * | 9/2002 | Singer ............................ 378/34 |
| 2003/0031017 | A1 | | 2/2003 | Tsuji |
| 2003/0071204 | A1 | | 4/2003 | Sandstrom et al. |

(Continued)

FOREIGN PATENT DOCUMENTS

| JP | 2008 028099 A | 2/2008 |
| JP | 2010 093044 | 4/2010 |
| JP | 2011 0119596 | 6/2011 |
| WO | WO 2009/080231 | 7/2009 |

OTHER PUBLICATIONS

Texas Instruments DLP™ System Optics Application Report DLPA022, Jul. 2010, Texas Instruments Incorporated.

(Continued)

*Primary Examiner* — Toan Ton
*Assistant Examiner* — Christina Riddle
(74) *Attorney, Agent, or Firm* — Opticus IP Law PLLC

(57) ABSTRACT

A programmable illuminator for a photolithography system includes a light source, a first optical system having a light uniformizing element, a programmable micro-mirror device, and a second optical system that forms an illumination field that illuminates a reticle. The programmable micro-mirror device can be configured to perform shutter and edge-exposure-blocking functions that have previously required relatively large mechanical devices. Methods of improving illumination field uniformity using the programmable illuminator are also disclosed.

20 Claims, 5 Drawing Sheets

(56) References Cited

U.S. PATENT DOCUMENTS

| | | |
|---|---|---|
| 2004/0057034 A1* | 3/2004 | Zinn et al. .................. 355/67 |
| 2004/0130561 A1 | 7/2004 | Jain |
| 2006/0003240 A1* | 1/2006 | Shim et al. .................. 430/30 |
| 2007/0002300 A1 | 1/2007 | Hansen et al. |
| 2008/0100816 A1 | 5/2008 | Mulder et al. |
| 2008/0220382 A1* | 9/2008 | Veselinovic .................. 430/346 |
| 2008/0266668 A1 | 10/2008 | Penn |
| 2009/0047604 A1 | 2/2009 | Stoeldraijer et al. |
| 2009/0168039 A1 | 7/2009 | Kok et al. |
| 2009/0174877 A1 | 7/2009 | Mulder et al. |
| 2009/0207396 A1 | 8/2009 | Melzer et al. |
| 2010/0026979 A1 | 2/2010 | Michaloski |
| 2010/0195077 A1* | 8/2010 | Koehler et al. .................. 355/67 |
| 2010/0265482 A1 | 10/2010 | Schubert et al. |
| 2011/0012010 A1 | 1/2011 | Major |
| 2011/0188016 A1 | 8/2011 | De Jager et al. |

OTHER PUBLICATIONS

Singapore Written Opinion, dated Aug. 9, 2013, for Singapore Patent Application 201205491, which is a counterpart application to U.S. Appl. No. 13/199,112.

Japanese Office Action, dated Oct. 21, 2013, for Japanese Patent Application 2012-179995, which is a counterpart to U.S. Appl. No. 13/199,112.

Singapore Search Report, mailed Jan. 11, 2013, for Singapore Patent Application 201205491, which is a counterpart application to U.S. Appl. No. 13/199,112.

* cited by examiner

PROGRAMMABLE ILLUMINATOR FOR A PHOTOLITHOGRAPHY SYSTEM

FIELD

The present disclosure relates generally to photolithography systems, and in particular to a programmable illuminator for a photolithography system.

BACKGROUND ART

A photolithography system has as its basic components an illuminator with a light source, a patterned reticle, a projection lens and a photosensitive (e.g., photoresist-coated) wafer. The illuminator illuminates the reticle with light from the light source. Light transmitted by or reflected from the reticle is then imaged by the projection lens onto the photosensitive wafer. The photosensitive wafer is then processed to form a pattern on the wafer. The photolithographic exposure process and post-exposure process is repeated with a number of different reticles to form on the wafer a semiconductor structure that defines an integrated circuit.

The photolithography system needs to provide a precise amount of exposure energy (i.e., an "exposure dose") to the photosensitive wafer over a well-defined region (i.e., "exposure field"). Conventional photolithography systems typically include a shutter formed by mechanical blades placed in the optical path within the illuminator to define the exposure dose. A mechanical aperture is also used to define the dimensions of the exposure field.

It is important that the photolithography system maintains the correct exposure dose so that the photolithography process has the largest process window with respect to resolution and depth of focus. The ability to maintain the proper exposure dose depends on the shutter timing and in particular the shutter switching, i.e., the off/on/off transition timing. For low exposure dose requirements, the amount of time the shutter is open becomes comparable to or even smaller than the amount of time needed to switch the shutter blades. There is no effective way to control that shutter-blade switching time apart from dramatically increasing the speed and acceleration of the shutter blades. However, this approach is limited by mechanical considerations. The increased acceleration and deceleration required cause vibrations in the optical system that adversely affect the performance of the photolithography system. Thus, using a conventional mechanical shutter to make small changes in the exposure dose without adversely affecting the operation of the photolithography system is a challenge.

Further, a photolithography system may need to accommodate reticles of different sizes. The patterned region of the reticle is called the reticle field. The reticle field has dimensions that correspond to the dimensions of the exposure field at the wafer. The exposure of the reticle field should not result in an exposure larger than the intended exposure field. The photolithography system thus usually includes the aforementioned mechanical aperture to define the exposure field dimensions. The mechanical aperture must be adjusted to physically match the size requirements of the exposure field. As the mechanical aperture includes mechanically driven blades, it can be a source of system failure and can adversely impact the mean time between failures (MTBF) of the photolithography system.

Some photolithographic exposures require that an annular portion of the photoresist (e.g., 2 to 4 mm) along the edge of the wafer remain unexposed. This may be the case for wafers that need to undergo an electroplating step after the photolithography exposure step. Normally, the photoresist on some of the exposure fields on the wafer ends up being exposed all the way out to the edge of the wafer. Presently, a mechanical ring system is used to prevent exposure of the photoresist near the wafer edge. However, this mechanical solution is not robust and is subject to failure, which can adversely impact the MTBF of the photolithography system.

SUMMARY

An aspect of the disclosure is a programmable illuminator for a photolithography system for illuminating over an optical path a reticle having a reticle field. The programmable illuminator includes, in order along an optical axis, a light source that generates actinic light, and a first optical system configured to receive the actinic light from the illuminator. The first optical system has at least one uniformizing element configured to form uniformized actinic light from the received actinic light. A programmable micro-mirror device is arranged downstream of the first optical system and includes an array of micro-mirrors. Each micro-mirror has an adjustable orientation. The programmable micro-mirror device is arranged to receive and selectively reflect the uniformized light according to a select configuration of orientations of the adjustable micro-mirrors. The programmable illuminator also includes a control unit that is operably connected to the programmable micro-mirror device and configured to control the orientations of the adjustable micro-mirrors. A second optical system is arranged to receive the selectively reflected uniformized light along the optical path and form an illumination field that illuminates at least a portion of the reticle field.

Another aspect of the disclosure is a method of illuminating a reticle field of a reticle supported in a photolithography system to form exposure fields in a photoresist layer supported by a semiconductor wafer and having an outer edge. The method includes generating actinic light and uniformizing the actinic light to form uniformized actinic light. The method also includes selectively reflecting the uniformized actinic light from (i.e., off of) a programmable micro-mirror device configured to provide a select orientation to each of a plurality of micro-mirrors that form a micro-mirror array. The method also includes forming from the selectively reflected uniformized actinic light an illumination field that illuminates at least a portion of the reticle field for a reticle field exposure time.

Additional features and advantages of the disclosure are forth in the detailed description that follows, and in part will be readily apparent to those skilled in the art from that description or recognized by practicing the disclosure as described herein, including the detailed description that follows, the claims, and the appended drawings. The claims are incorporated into and constitute part of the detailed description of the disclosure.

It is to be understood that both the foregoing general description and the following detailed description present embodiments of the disclosure and are intended to provide an overview or framework for understanding the nature and character of the disclosure as it is claimed. The accompanying drawings are included to provide a further understanding of the disclosure and are incorporated into and constitute a part of this specification. The drawings illustrate various embodiments of the disclosure and together with the description serve to explain the principles and operations of the disclosure.

DETAILED DESCRIPTION

Reference is now made in detail to the present preferred embodiments of the disclosure, examples of which are illustrated in the accompanying drawings. Whenever possible, the same reference numbers and symbols are used throughout the drawings to refer to the same or like parts.

The disclosure is directed to inter alia a programmable illuminator for a photolithography system that uses a reticle or mask. An example photolithography system is first described, followed by a detailed description of an example programmable illuminator that is suitable for use in the example photolithography system.

Photolithography System

An example embodiment of the disclosure is a photolithography system that uses the programmable illuminator of the present disclosure. Example photolithography systems in which the programmable illuminator disclosed herein can be adapted for use are described in U.S. Pat. Nos. 7,177,099; 7,148,953; 7,116,496; 6,863,403; 6,813,098; 6,381,077; and 5,410,434, which patents are incorporated by reference herein in their entirety.

Figure 1:
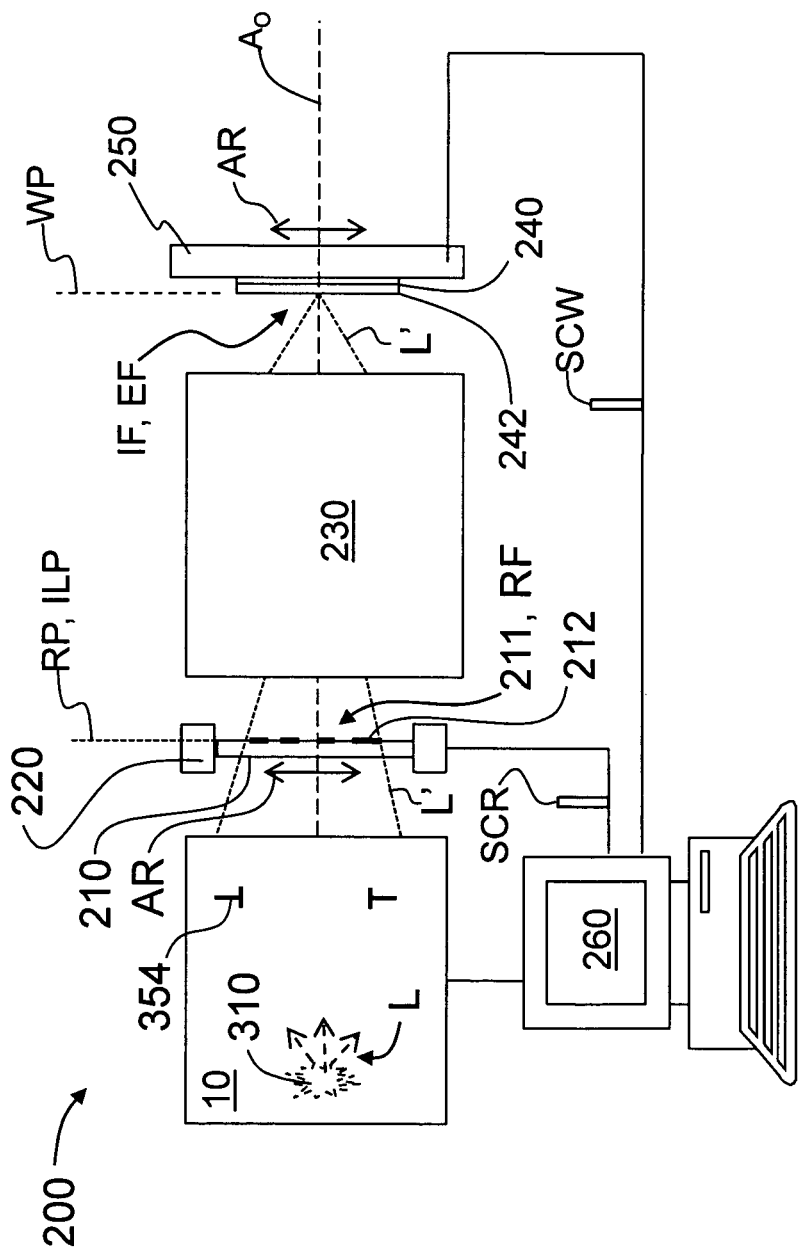
FIG. 1 is a schematic diagram of an example UV lithography system in which the programmable illuminator of the present disclosure is suitable for use.

FIG. 1 is a schematic diagram of an example photolithography system 200 in which the programmable illuminator disclosed herein is suitable for use. The photolithography system 200 includes, in order along an optical axis $A_O$, a programmable illuminator 10 as described in greater detail below, a reticle 210 (e.g., a patterned mask) supported by a reticle stage 220 at a reticle plane RP, a projection lens 230, and a wafer 240 supported by a wafer stage 250 at a wafer plane WP. The reticle 210 includes a patterned region 211 that includes pattern elements 212 and that defines a reticle field RF. The wafer 240 includes an outer edge 241 (see FIG. 3).

The wafer 240 includes a photosensitive coating 242 (e.g., photoresist) on the wafer surface that is activated by light (i.e., "actinic light") L generated by a light source 310 located in programmable illuminator 10. In an example, actinic light L includes an ultraviolet wavelength and in a more specific example includes one of a g-line wavelength, an h-line wavelength, an i-line wavelength, a 248 nm wavelength and a 193 nm wavelength.

The photolithography system 200 also includes a controller 260 operably connected to programmable illuminator 10, reticle stage 220 and wafer stage 250. The controller 260 is configured to control the operation of photolithography system 200. An example controller 260 includes a computer such as a personal computer or workstation. In an example, controller 260 includes apparatus-control software that includes instructions, embodied in a computer-readable medium, that control the various components of photolithography system 200.

The programmable illuminator 10 is configured to generate an illumination field ILF (see FIG. 2A) at an illumination plane that corresponds to reticle plane RP. The illumination field ILF includes uniformized actinic light L' and illuminates at least a portion of reticle field RF over a reticle field exposure time so that projection lens 230 forms a corresponding image field IF at wafer plane WP over a corresponding wafer exposure time. The wafer stage 250 is movable (e.g., via a control signal SCW from controller 260) so that image field IF can be placed at different parts of wafer 240 to form various exposure fields EF on the wafer and in particular in photoresist 242. In an example, reticle stage 220 is movable via a control signal SCR from controller 260.

Figure 2B:
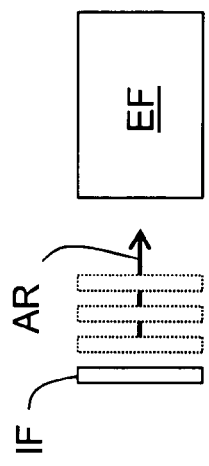
FIG. 2B is a schematic diagram of an example scanning illumination field and an example exposure field associated with the scanned illumination field.
Figure 2D:
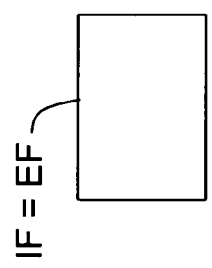
FIG. 2D is similar to FIG. 2B and illustrates an example of a full-field image field that corresponds in size to the corresponding exposure field.
Figure 2A:
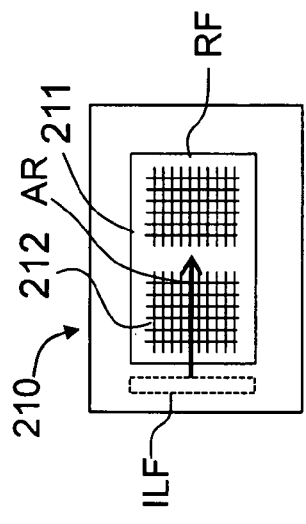
FIG. 2A is a schematic front-on view of an example reticle showing the reticle pattern that defines the reticle field and also showing an example of a scanned illumination field.

Thus, uniformized actinic light L' from programmable illuminator 10 is used to illuminate at least a portion of patterned region 211 that defines reticle field RF. The illuminated portion of reticle field RF is then imaged onto photosensitive surface 242 of wafer 240 via projection lens 230. In an example embodiment, reticle 210 and wafer 240 are moved together in a manner that scans image field IF over the wafer as illumination field ILF scans over the reticle field RF, as illustrated by arrows AR in FIG. 1 and also as schematically illustrated in FIGS. 2A and 2B. This operation forms a scanned exposure field EF that is larger than either the illumination field ILF or the image field IF. This process is then repeated for a different (unexposed) region of wafer 240. This printing approach is referred to in the art as "step and scan."

Figure 2C:
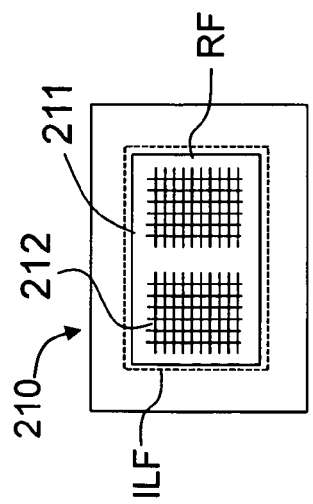
FIG. 2C is similar to FIG. 2A and illustrates an example of a full-field illumination field.

In another example, illumination field ILF illuminates the entire reticle field RF at once, thereby forming, in a single exposure, one exposure field EF. The wafer 240 is then moved, and the single static exposure is repeated. This printing approach is called "step and repeat." FIG. 2C is similar to FIG. 2A and illustrates an example of a full-field illumination field ILF used for step and repeat printing. FIG. 2D is similar to FIG. 2B and illustrates an example of a full-field image field IF that corresponds in size to the corresponding exposure field EF as used in step and repeat printing.

Figure 3:
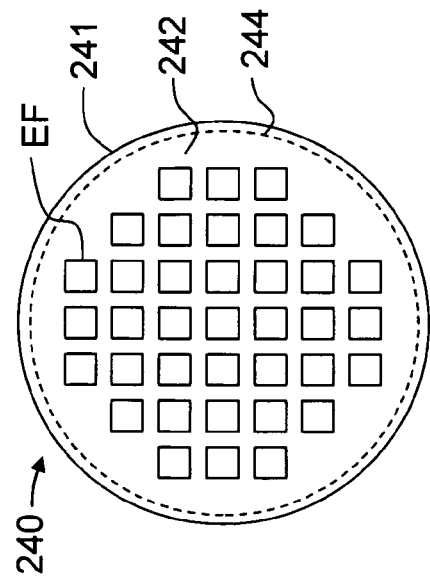
FIG. 3 is a plan view of a semiconductor wafer with exposure fields formed thereon by the photolithography system of FIG. 1.

With reference to FIG. 3, exposure fields EF formed on wafer 240 in photoresist 242 are in turn used to form integrated circuit chips via standard photolithographic and semiconductor processing techniques.

Programmable Illuminator

Figure 4:
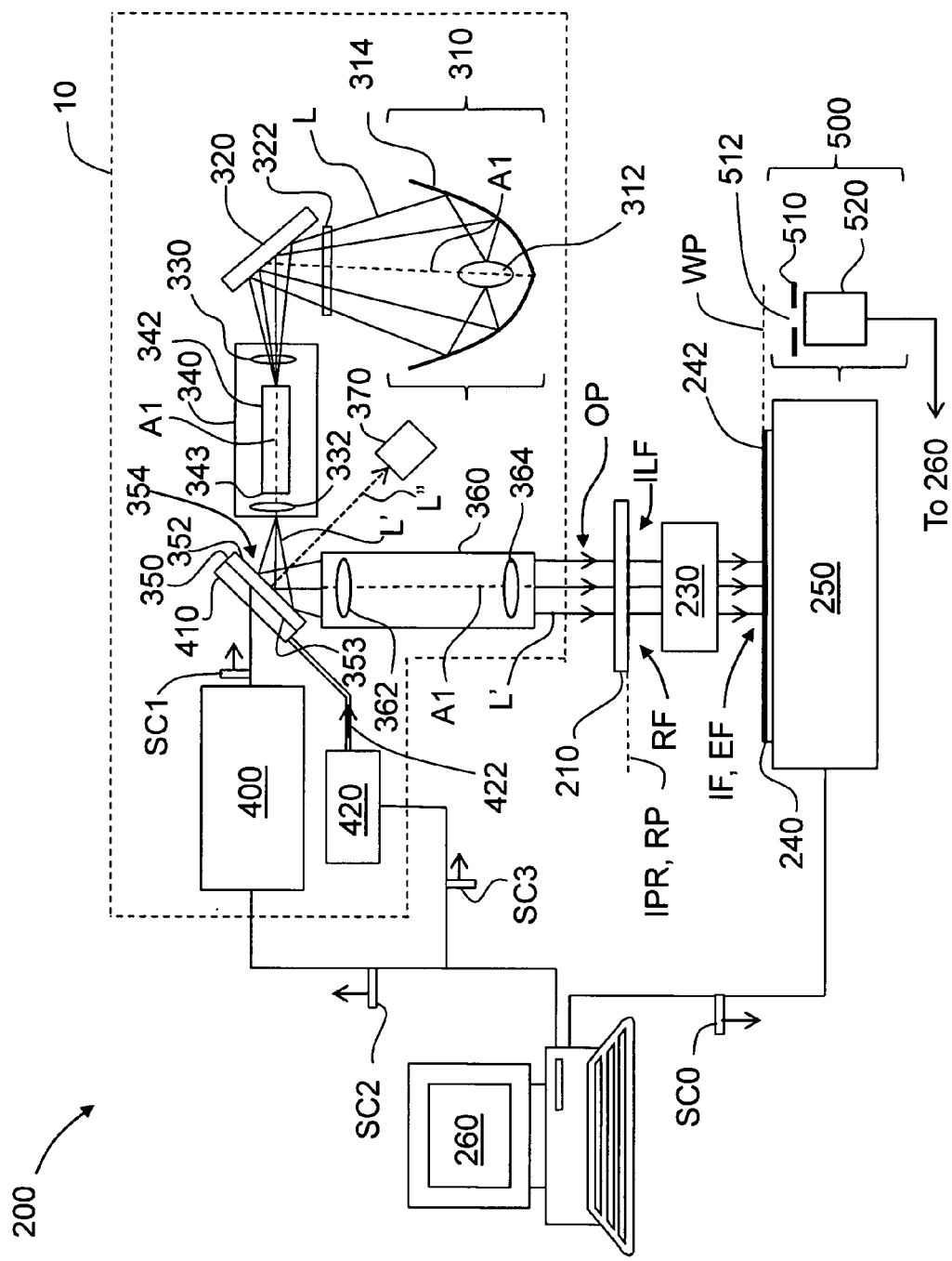
FIG. 4 illustrates an example embodiment of an example programmable illuminator according to the disclosure.

FIG. 4 is a schematic diagram of an example embodiment of programmable illuminator 10. The illuminator 10 includes an optical axis A1 that defines a central axis of an optical path OP of actinic light L (including uniformized actinic light L') through the illuminator and to reticle 210. The optical axis A1 coincides with optical axis $A_O$ of photolithography system 200. The programmable illuminator 10 includes the aforementioned light source 310 that lies along optical axis A1 and that emits the aforementioned (non-uniformized) actinic light L. An example light source 310 includes a mercury arc lamp as shown, which includes a mercury-arc bulb 312 and a reflector 314. Other types of light sources 310, such as lightemitting-diode (LED)-based light sources having one or more LEDs, or one or more lasers, may be used.

The programmable illuminator 10 optionally includes a fold mirror 320 along optical axis A1 and immediately downstream of light source 310 to fold the optical path OP and thereby provide compactness. The fold mirror 320 may also be a cold mirror, that is, it may be cooled to remove heat from light source 310 generated by non-actinic wavelengths emitted by the light source. An optical filter 322 may also be placed in the optical path OP, for example, adjacent and upstream of fold mirror 320, as shown. The optical filter 322 may be configured to pass actinic light L while substantially blocking or re-directing non-actinic wavelengths emitted by light source 310.

The programmable illuminator 10 also optionally includes along optical axis A1 and downstream of fold mirror 320 a first optical system 340, a programmable micro-mirror device 350 having a front surface 352 and a back surface 353, and a second optical system 360. The front surface 352 includes adjustable micro-mirror elements 356 (i.e., micro-mirrors), as discussed in greater detail below. The first optical system 340 is configured to receive light from light source 310 and direct it to front surface 352 of programmable micro-mirror device 350. In an example, first optical system 340 is configured to receive actinic light L and uniformized it for form uniformized actinic light L'. The uniformized actinic light L' is then incident upon front surface 352 of programmable micro-mirror device 350. An example intensity uniformity of uniformized actinic light L' at front surface 352 is +/−2% or better (i.e., smaller, such as +/−1%). Here, it is noted that uniformized actinic light L' is the same as actinic light L except for the fact that the uniformized actinic light has a more uniform intensity distribution.

In an example embodiment, first optical system 340 includes at least one light uniformizing element 342, such as at least one light pipe and/or at least one diffusing element (i.e., diffuser). The first optical system 340 may also include a focusing lens 330 and an imaging lens 332, which in an example are disposed adjacent the input and output ends, respectively, of light uniformizing element 342. Also in an example embodiment, first optical system 340 has a reduction magnification M1 (i.e., a magnification less than unity).

In an example, the at least one light uniformizing element 342 has an output end 343 with select dimensions. The output end 343 of light uniformizing element 342 can be demagnified by first optical system 340 by approximately 2× (i.e., magnification M/=+0.5 or −0.5) so that the image size of this output end substantially matches the dimensions of front surface 352 of programmable micro-mirror device 350. The exact value of reduction magnification M1 of first optical system 340 depends upon the dimensions of output end 343 of light uniformizing element 342 and the dimensions of front surface 352 of programmable micro-mirror device 350. In an example, imaging lens 332 adjacent the output end of light uniformizing element 342 provides the required reduction magnification M1.

Second optical system 360 is configured to receive uniformized actinic light L' reflected by front surface 352 of programmable micro-mirror device 350 and direct it to reticle 210 to define illumination field ILF at an illumination plane ILP, which corresponds to reticle plane RP. The illumination field ILF illuminates at least a portion of reticle field RF. In an example embodiment, second optical system 360 is configured to preserve the degree of intensity uniformity in uniformized actinic light L' that was reflected by front surface 352 of programmable micro-mirror device 350. The nature of the reflection of uniformized actinic light L' from front surface 352 is discussed in greater detail below.

The second optical system 360 is shown by way of example to include a collection lens 362 and a focusing lens 364. The lenses 362 and 364 can each comprise one or more lens elements and are shown schematically as single elements for ease of illustration. In an example, lenses 362 and 364 are configured to collectively define a relay lens system.

In an example embodiment, second optical system 360 has a magnification selected to take the uniformized actinic light L' reflected by front surface 352 of programmable micro-mirror device 350 and form an illumination field ILF sized to the reticle field RF. In an example where micro-mirrors 356 (introduced and discussed below in connection with FIG. 5) have a dimension of x1 microns and the illumination field ILF needs to transition from bright to dark over a distance x2, the second optical system 360 can be configured to have a magnification M2=x2/x1. By way of example, for a micro-mirror dimension x1=20 microns and a bright-to-dark transition distance x2=100 microns, the magnification M2=5 (or "5×"). The magnification M2 can be smaller than x2/x1 in the case where a sharper bright-to-dark transition is acceptable. However, it is noted that a larger magnification may be problematic because the area of in the illumination field ILF defined by a single micro-mirror 356 may start to become too large.

Figure 5:
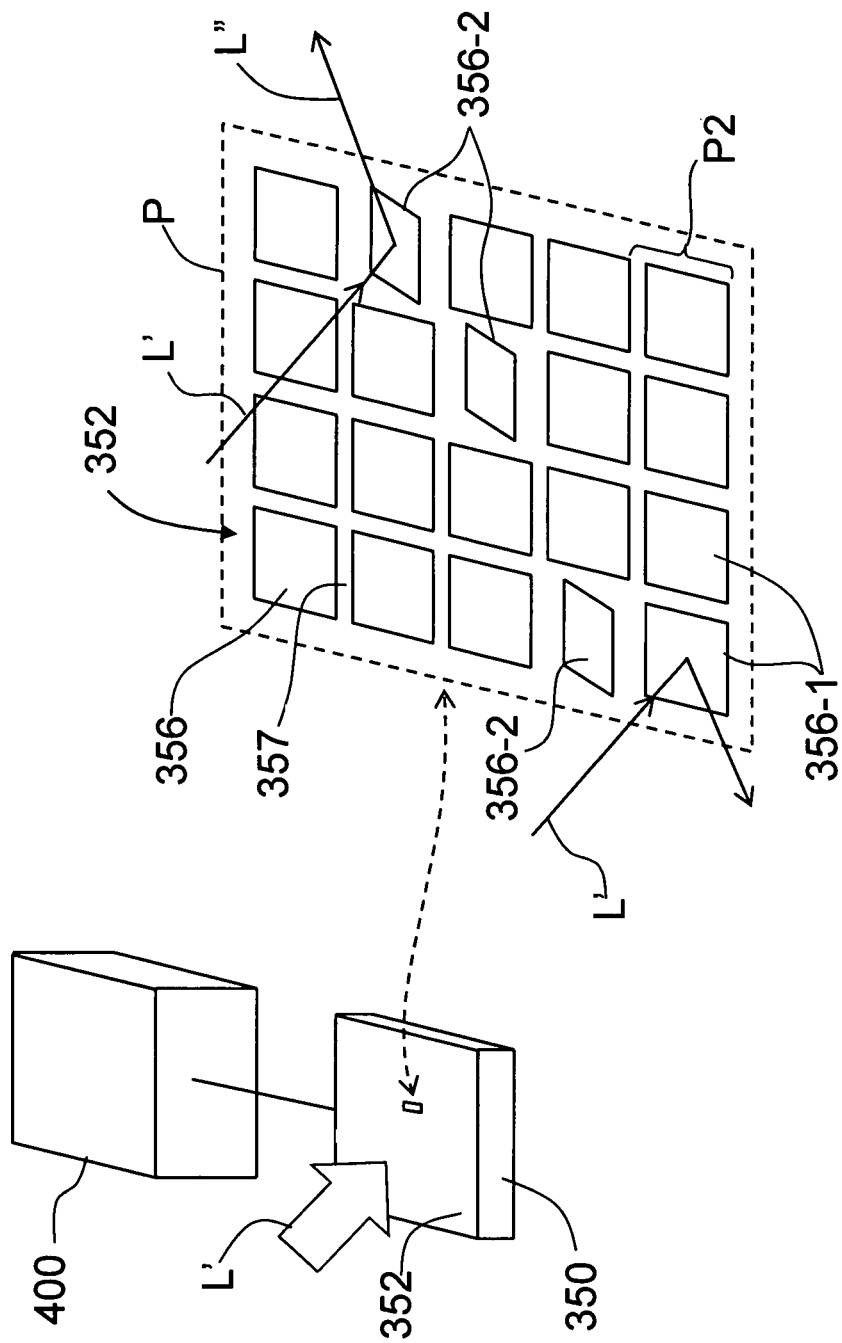
FIG. 5 is a elevated view of an example programmable micro-mirror device used in the programmable illuminator of FIG. 4.

The second optical system 360 may also be designed to have a select resolution R2 that takes into account the fact that it may be undesirable in certain cases to resolve gaps 357 (i.e., "dead zones") between micro-mirrors 356 (see FIG. 5). Thus, it may be desirable to configure second optical system 360 so that its resolution R2 is such that gaps 357 are blurred to the point where the illumination field ILF appears substantially uniform (e.g., to within +/−2%). In an example, resolution R2 is defined by 1 period (P2) of a micro-mirror 356 plus the adjacent gap 357 (see FIG. 5). Such a resolution R2 serves to substantially blur gaps 357 and generally average out the illumination in illumination field ILF.

With reference again to FIG. 4, illuminator 10 includes a beam dump 370 arranged to receive deflected light L" from front surface 352 of programmable micro-mirror device 350 as described below. The beam dump 370 is configured to absorb or otherwise prevent deflected light L" from returning to optical path OP and, in particular, from reaching reticle field RF.

The illuminator 10 includes a control unit 400 that is operably connected to and configured to control the operation of programmable micro-mirror device 350. The control unit 400 is also operably connected to controller 260. An example control unit 400 is a motion controller. The control unit 400 is programmable and controls the operation and configuration of programmable micro-mirror device 350 via a control signal SC1. The controller 260 in turn controls the operation of control unit 400 via a control signal SC2.

Programmable Micro-Mirror Device

FIG. 5 is a top-elevated view of an example programmable micro-mirror device 350. The programmable micro-mirror device 350 includes on front surface 352 an array of adjustable mirror elements 356 (i.e., micro-mirrors). Adjacent micro-mirrors 356 are separated by the above-mentioned gaps 357. An example programmable micro-mirror device 350 is a DLP® chip, available from Texas Instruments in Austin, Tex. Another example programmable micro-mirror device 350 can include a micro-electrical mechanical system (MEMS) device. Example programmable micro-mirror devices 350 are described in U.S. Pat. Nos. 4,441,791; 4,615,595; and 4,956,610, which are incorporated by reference herein.

The adjustable micro-mirrors 356 are addressable, and control unit 400 can be programmed to address the adjustable micro-mirrors to control their relative orientations in a select manner, for example, to have a select pattern of relative orientations and to change one select pattern to another select pattern. In an example, the programmability of control unit 400 is enabled by software or firmware in the control unit that stores instructions in a computer-readable medium that causes the array of addressable micro-mirrors 356 of programmable micro-mirror device 350 to form a select configuration of micro-mirror orientations.

An example programmable micro-mirror device 350 includes approximately 1 to 2 million adjustable micro-mirrors 356 (e.g., a 1,000×1,000 array), each having an approximately square shape measuring 10 to 20 microns on a side. Each adjustable micro-mirror 356 is individually addressable and in an example can be programmed to move into one of two physical reflecting states. In an example embodiment, in a first state a given adjustable micro-mirror 356 is tilted at an orientation of approximately +10 degrees, while in a second state, it is tilted in an orientation of approximately −10 degrees, with the angle being measured from an intermediate reference direction.

By way of illustration, some adjustable micro-mirrors 356 (two are identified by reference number 356-1) in FIG. 5 are shown as having an orientation in a first state, that is, as substantially parallel to a plane P defined generally by front surface 352. Other adjustable micro-mirrors identified by reference number 356-2 are shown as having an orientation in a second state that is not parallel (i.e., is angled relative) to plane P. Thus, uniformized actinic light L' incident upon an adjustable mirror element 356-1 is reflected in one direction (say, along optical path OP), while uniformized actinic light L' incident upon an adjustable mirror element 356-2 is reflected in another direction (say, out of optical path OP) and forms deflected light L" that is directed, for example, to beam dump 370 as shown in FIG. 4.

In an example configuration of programmable micro-mirror device 350, adjustable micro-mirrors 356 are in an "on" reflecting state when they reflect incident uniformized actinic fight L' along optical path OP and toward second optical system 360 and are in an "off" reflecting state when they reflect the incident uniformized actinic light out of the optical path OP and to beam dump 370 as deflected light L". Note that in an example where all of the micro-mirrors 356 in the "on" state reflect incident uniformized actinic light L' in the same direction and for the same amount of time (i.e., none of the "on" mirrors are oscillated or turned off), the array of adjustable micro-mirrors acts as a plane mirror that provides substantially uniform reflectivity.

For programmable micro-mirror device 350 to work most effectively in illuminator 10, each adjustable micro-mirror 356 must efficiently reflect uniformized actinic light L'. Thus, in an example embodiment, adjustable micro-mirrors 356 include a reflectivity coating configured (e.g., with multiple layers) to optimally reflect uniformized actinic light L'.

With reference again to FIG. 4, in example embodiment, illuminator 10 includes a cooling element 410 operably connected to a cooling unit 420. The cooling element 410 is operably disposed relative to programmable micro-mirror device 350 (e.g., on or adjacent back surface 353), i.e., is in thermal communication therewith, so that the cooling element can remove heat from the programmable micro-mirror device. The cooling unit 420 may be configured to flow a cooling fluid 422 through cooling element 410 to maintain the temperature of programmable micro-mirror device 350 at or below a critical temperature (e.g., 60° C.). In an example, cooling unit 420 is operably connected to controller 260 and is controlled by a control signal SC3 from the controller.

Shutter Configuration

In an example embodiment, programmable micro-mirror device 350 is configured via the programming of control unit 400 to act as a shutter. When every adjustable micro-mirror 356 is placed in the "off" reflecting state, no uniformized actinic light L' is transmitted from programmable micro-mirror device 350 to reticle 210, i.e., the illumination field ILF is turned off. Likewise, when every adjustable micro-mirror 356 is placed in the "on" reflecting state, uniformized actinic light L' is transmitted from programmable micro-mirror device 350 to reticle 210, i.e., the illumination field ILF is turned on.

The shutter requirements in a photolithography system are such that the shutter should transition from open to close (or from close to open) in a time that is less than 1% of the total exposure time. Some highly-sensitive resists may require exposure times of 100 milliseconds (ms) or less. Hence, it is desirable to have shutter transition times of less than 1 ms. The adjustable micro-mirrors 356 can be transitioned between the on and off reflecting states very quickly (i.e., at a sub-millisecond switching times) as compared to a mechanical shutter that operates at a several-millisecond switching times. This provides the ability to finely control the exposure dose even for low-level exposures.

Furthermore, the reliability (i.e., MTBF) of commercially available programmable micro-mirror devices 350 is generally much better than that of mechanical shutters (e.g., by a factor of about 1,000). In addition, because the mass of each adjustable micro-mirror 356 is very small, programmable micro-mirror device 350 does not generate vibrations that can degrade the performance of photolithography system 200.

Edge Protection Configuration

Figure 6:
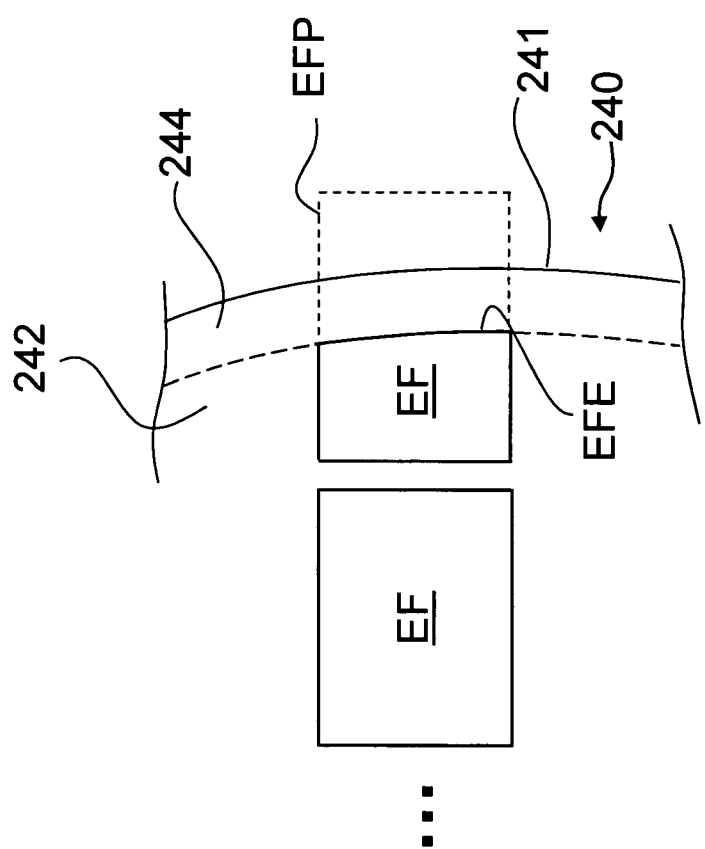
FIG. 6 is a close-up view of a portion of a wafer showing how the edge exposure fields are truncated to prevent the annular edge portion of the photoresist from being exposed.

FIG. 6 is a close-up view of wafer 240 showing an annular edge portion 244 of photoresist 242 along with two exposure fields EF. In an example embodiment, programmable micro-mirror device 350 is configured to prevent exposure of annular edge portion 244 by an exposure field EF. This obviates the need for a mechanical edge protection ring.

This edge protection function is accomplished by controller 260 monitoring the locations of the various exposure fields EF as they are formed on photosensitive surface 242 (see FIG. 3). For exposure fields EF that would otherwise extend into or overlap annular edge portion 244, as illustrated by an exposure field portion EFP of the rightmost exposure field EF in FIG. 6, controller 260 includes in control signal SC2 instructions for control unit 400 to configure programmable micro-mirror device 350 to selectively illuminate only a portion of reticle field RF. This selective illumination is designed to reduce the size of the problematic exposure fields EF so that they do not extend into or overlap annular edge portion 244 of photoresist 242, as is illustrated in the rightmost exposure field EF in FIG. 6. The portion EFP of the rightmost exposure field EF is not actually formed, and an outside edge EFE of the rightmost exposure field substantially corresponds to the inside curvature of annular edge portion 244.

Thus, the edge exposure fields EF can be truncated precisely along the boundary of annular edge portion 244. In an example, the edge protection can be maintained with an accuracy in the range from about 20 to 40 microns, which is generally better than the placement accuracy of the mechanical edge protection ring. Thus, the edge protection function can be performed dynamically and on the fly.

To implement this feature, it will be necessary to program the micro-mirror assembly to coordinate with the stage motion and the field size. It is necessary to calculate the wafer edge position relative to the exposure field based upon the wafer's location and size. For example, the wafer dimension (i.e., 200 or 300 mm in diameter) would be well known at the time the wafer is loaded onto the tool. The center of the wafer will be computed from the alignment marks located on the wafer (which will be captured prior to any exposures). From this, the perimeter of the wafer can be calculated. When a perimeter intersects with the exposure field, the system controller instructs the micro-mirror array such that, the mirrors corresponding to the exposure along the perimeter, are turned off (i.e., no exposure is made).

Aperture Configuration

An aspect of the disclosure includes using programmable micro-mirror device 350 to define an aperture 354 (see FIG. 1 and FIG. 4) for programmable illuminator system 10 at front surface 352. With a large number of adjustable micro-mirrors 356 (e.g., a 1,000×1,000 array), and with each micro-mirror being individually addressable, one can define the intensity profile of uniformized actinic light L' reflected from the adjustable micro-mirrors with very high precision. For adjustable micro-mirrors 356 each having a square shape measuring 10 microns on a side, the intensity profile of uniformized actinic light L' reflected from the programmable micro-mirror device 350 can be defined with an accuracy of approximately 10 microns. The control unit 400 can be programmed so that programmable micro-mirror device 350 defines the dimensions of the required reticle field RF. In an example, an illumination field ILF having a dimension of 34 mm can be defined to within approximately 34 microns. It is desirable to define illumination field ILF such that the corresponding exposure fields EF can accommodate scribe lines in between the exposure fields. The scribe line space is typically about 75 to 100 microns. This is advantageous because, in production, the die and field sizes on a wafer can change from product to product. Hence, the photolithography system needs to be able to modify the area of the exposure field. This is presently accomplished by adjusting mechanical apertures at the reticle plane.

Controlling Illuminator Uniformity

Thus, the size of exposure field EF can be controlled by ensuring that certain adjustable micro-mirrors 356 remain off while others can be switched on or off during the exposure process.

In an example, the illumination uniformity of illumination field ILF is improved (e.g., to +/−1% uniformity or better) by selective configuration of adjustable micro-mirrors 356. In an example, the selective reflection includes oscillating one or more adjustable micro-mirrors 356 at a high rate (e.g., at a kilohertz or faster). In another example, the selective reflection includes turning off select adjustable. micro-mirrors 356 earlier than others to compensate for known regions of illumination non-uniformity. This type of selective programming of programmable micro-mirror device 350 can be used to reduce or minimize an amount of intensity non-uniformity in illumination field ILF as compared to an amount of intensity non-uniformity present when micro-mirrors 356 are configured to provide uniform reflection, i.e., all the micro-mirrors have the same orientation such that the front surface 352 of programmable micro-mirror device acts substantially like a planar mirror. In this way, the spatial non-uniformities of the optical system can be compensated.

Selective programming of programmable micro-mirror device 350 can be used to compensate for illumination non-uniformities. Spatial non-uniformities in the intensity of actinic light L and uniformized actinic light L' may arise as this light travels over the optical path OP. In one example, non-uniformities arise from imperfections in the first and/or second optical systems 340 and 360 or other elements in the optical path. In another example, spatial intensity non-uniformities arise when the first optical system 340 images the end 343 of light uniformizing element 342 to the front surface 352 of programmable micro-mirror device 350. In another example, spatial intensity non-uniformities can arise when the second optical system images the front surface 352 of the programmable micro-mirror device onto reticle 210. Spatial non-uniformities at wafer 240 can arise when projection lens 230 images the illuminated reticle field RF to form the corresponding exposure field EF in photoresist 242.

In an example, the compensation for illumination non-uniformities achieved by selectively programming programmable micro-mirror device 350 allows for reducing the tolerances on other components of programmable illuminator 10.

The selective programming of programmable micro-mirror device 350 can be used to compensate for spatial illumination non-uniformities arising from these as well as other types of sources. In an example, compensating spatial illumination non-uniformities includes measuring the static (i.e., with the shutter continuously open) illumination uniformity at the wafer plane WP. Typically, the intensity at the wafer plane does not change spatially abruptly, and measurements with a spatial resolution of several hundred microns is acceptable.

Hence, with reference to FIG. 4, there is shown an intensity meter 500 comprising an aperture member 510 that defines a small (<500 micron) aperture 512 in front of a photodetector 520. Photodetector 520 is operably connected to controller 260 (or a separate computer, not shown). Intensity meter 500 can be used to map out the illumination uniformity at the wafer plane by moving the intensity meter over to where the exposure field EF would be formed. One measurement can be made every 1 mm in both the x and y dimensions in the wafer plane WP. Once this intensity mapping is performed and the intensity distribution known, this information can be used to improve the illumination uniformity during exposure by adjusting the "on" duration of the micro-mirrors 356. For example, if one area at the wafer plane WP has an intensity that is 5% too high (relative to the remainder of the wafer), then, control unit 400 that controls programmable micro-mirror device 350 can be programmed so that this particular area is exposed for 5% less time during exposures. If another area is 3% too low, then the micro-mirrors 356 associated with this particular area can be controlled so that this area has a 3% longer exposure time. In this way, the dynamic shutter can improve (i.e., reduce or substantially eliminate) static intensity non-uniformities.

It will be apparent to those skilled in the art that various modifications and variations can be made to the present disclosure without departing from the spirit and scope of the disclosure. Thus it is intended that the present disclosure cover the modifications and variations of this disclosure provided they fall within the scope of the appended claims and their equivalents.

What is claimed is:

1. A photolithography system for illuminating over an optical path a reticle having a reticle field to form one or more exposure fields on a wafer having a surface, an edge and a coating of photoresist that includes an annular edge portion adjacent the wafer edge, comprising:
a light source that generates actinic light;
a first optical system configured to receive the actinic light from the light source, the first optical system having at least one uniformizing element configured to form uniformized actinic light from the received actinic light;

a programmable micro-mirror device having an array of micro-mirrors, with each micro-mirror having an adjustable orientation, the programmable micro-mirror device being arranged to receive and selectively reflect the uniformized light according to a select configuration of orientations of the adjustable micro-mirrors;

a control unit operably connected to the programmable micro-mirror device and configured to control the orientations of one or more of the adjustable micro-mirrors;

a second optical system arranged to receive the selectively reflected uniformized light along the optical path and to form an illumination field that illuminates the reticle field;

a projection lens operably disposed between the reticle and the wafer, the projection lens serving to image the one or more exposure fields in the photoresist based on the illuminated reticle field, wherein the one or more exposure fields include at least one edge exposure field that would at least partially overlap the annular edge portion of the photoresist if the reticle field were fully illuminated; and wherein the control unit controls the select orientation of the micro-mirrors of programmable micro-mirror device to partially illuminate the reticle so that no portion of the edge exposure field extends into the annular edge portion of the photoresist.

2. The photolithography system of claim 1, further comprising the light source being configured to generate the actinic light to have an ultraviolet wavelength.

3. The photolithography system of claim 1, further comprising the control unit being configured to operate the programmable micro-mirror device as a shutter by configuring the control unit to change the select orientation of the adjustable micro-mirrors between first and second reflecting states that respectively reflect the uniformized actinic light into and out of the optical path.

4. The photolithography system of claim 3, further comprising a beam dump arranged to receive the uniformized actinic light deflected out of the optical path by the programmable micro-mirror device configured in the second select orientation.

5. The programmable illuminator of claim 1, further comprising the control unit being configured to operate the programmable micro-mirror device to define an aperture.

6. The photolithography system of claim 1, further comprising the control unit configured to perform at least one of: a) scanning the illumination field over the reticle field, and b) illuminating the reticle field with a non-scanning illumination field in a single exposure.

7. The photolithography system of claim 1, further comprising the control unit being configured to operate the programmable micro-mirror device to reduce or minimize an amount of intensity non-uniformity in the illumination field as compared to an amount of intensity uniformity present when the micro-mirrors are configured for substantially uniform reflection.

8. A method of illuminating a reticle field of a reticle supported in a photolithography system to form exposure fields in a photoresist layer supported by a semiconductor wafer and having an outer edge, wherein the photoresist layer includes an annular edge portion adjacent the wafer outer edge, the method comprising:

generating uniformized actinic light;

selectively reflecting the uniformized actinic light from a programmable micro-mirror device configured to provide a select orientation to each of a plurality of micro-mirrors that form a micro-mirror array; and forming from the selectively reflected uniformized actinic light an illumination field that illuminates the reticle field to form at least one edge exposure field that would at least partially overlap the annular edge portion of the photoresist if the reticle field were fully illuminated; and controlling the programmable micro-mirror device to partially illuminate the reticle field so that no portion of the at least one edge exposure field extends into the annular edge portion of the photoresist.

9. The method of claim 8, further comprising configuring the plurality of micro-mirrors to define a shutter that controls an amount of uniformized actinic light in the illumination field.

10. The method of claim 8, further comprising configuring the plurality of micro-mirrors to define an illuminator aperture that defines dimensions of the illumination field.

11. The method of claim 8, further comprising:
scanning the illumination field over the reticle field; and
changing the illumination field while scanning the reticle field by changing the select orientation of the array of micro-mirrors.

12. The method of claim 8, wherein the wafer has a size and further comprising:
forming the exposure fields at different positions on the wafer, and wherein controlling the programmable micro-mirror device includes determining, based on the wafer size and the exposure field positions, which of the exposure fields constitutes the at least one edge exposure field.

13. The method of claim 8, further comprising during the illumination of the reticle field by the illumination field at least one of:
a) rapidly oscillating one or more of the micro-mirrors between an on and an off state, and
b) changing an amount of time of one or more of the micro-mirrors is in an on state.

14. The method of claim 8, further comprising providing the select orientation to each of a plurality of micro-mirrors to reduce or minimize an amount of intensity non-uniformity in the illumination field as compared to an amount of intensity uniformity present when the micro-mirrors are configured for substantially uniform reflection.

15. The method of claim 8, further comprising:
performing multiple reticle illuminations to form respective multiple exposure fields in the photoresist layer; and
defining a reticle field exposure time for the multiple reticle illuminations by turning on and off the micro-mirrors.

16. The method of claim 8, further comprising:
performing multiple reticle illuminations to form respective multiple exposure fields in the photoresist layer, wherein at least one of the multiple exposure fields comprises the at least one edge exposure field; and
defining an illumination field intensity distribution that is different for the at least one edge exposure field than for non-edge exposure fields.

17. The method of claim 8, wherein the annular edge portion has a width of between 2 mm and 4 mm.

18. A method of forming exposure fields in photoresist supported on a wafer having a size and an outer edge, wherein the photoresist includes an annular edge portion adjacent the wafer edge, comprising:

directing uniformized actinic light to a programmable micro-mirror device having micro-mirrors each with an adjustable orientation;

selectively reflecting the uniformized actinic light from the micro-mirrors of the programmable micro-mirror device to form an illumination field;

repeatedly illuminating a reticle having a reticle field to form the multiple exposure fields at different positions in the photoresist, wherein the multiple exposure fields include at least one edge exposure field that would extend into the annular edge portion of the photoresist if the reticle field is fully illuminated; and adjusting the orientation of at least some of the micro-mirrors to cause the illumination field to partially illuminate the reticle field so that the at least one edge exposure field does not extend into the annular edge portion of the photoresist.

19. The method of claim 18, wherein the annular edge portion has a width of between 2 mm and 4 mm.

20. The method of claim 18, wherein said adjusting of the orientation of at least some of the micro-mirrors is based on the wafer size and the different positions of the exposure fields.

* * * * *